United States Patent [19]
Rosen et al.

[11] Patent Number: 5,570,317
[45] Date of Patent: Oct. 29, 1996

[54] MEMORY CIRCUIT WITH STRESS CIRCUITRY FOR DETECTING DEFECTS

[75] Inventors: Eitan Rosen; Yakov Milstain, both of Haifa, Israel

[73] Assignee: Intel Corporation, Santa Clara, Calif.

[21] Appl. No.: 277,148

[22] Filed: Jul. 19, 1994

[51] Int. Cl.⁶ .................................................. G11C 13/00
[52] U.S. Cl. .......................................... 365/200; 365/203
[58] Field of Search ................................. 365/200, 203, 365/189.01

[56] References Cited

U.S. PATENT DOCUMENTS

| | | | |
|---|---|---|---|
| 4,991,137 | 2/1991 | Matsumoto | 365/203 |
| 5,029,137 | 7/1991 | Hoshi | 365/203 |
| 5,062,079 | 10/1991 | Tsuchida et al. | 365/203 |
| 5,138,579 | 8/1992 | Tatsumi et al. | 365/203 |
| 5,157,631 | 10/1992 | Shimogawa | 365/203 |
| 5,446,694 | 8/1995 | Tanaka et al. | 365/203 |

*Primary Examiner*—Terrell W. Fears
*Attorney, Agent, or Firm*—Blakely, Sokoloff, Taylor & Zafman

[57] ABSTRACT

A memory circuit is disclosed with stress circuitry for detecting data retention defects in the memory cells. The memory circuit comprises a memory cell array coupled to bit lines, an access circuit coupled to access the memory cells, and a discharge circuit coupled to stress the memory cells.

10 Claims, 4 Drawing Sheets

MEMORY CIRCUIT WITH STRESS CIRCUITRY FOR DETECTING DEFECTS

BACKGROUND OF THE INVENTION

1. Field of the Invention

The present invention pertains to the field of integrated circuit devices. More particularly, this invention relates to a random access memory having circuitry for stressing memory cells.

2. Background

A typical prior static random access memory (SRAM) comprises an array of SRAM cells. Each SRAM cell typically comprises a set of six transistors. The six transistors in a typical SRAM cell are arranged as a pair of cross coupled inverter circuits and a pair of pass gates. The pull-up transistors of the inverter circuits usually prevent leakage currents in the SRAM cell from discharging the internal data storage nodes of the SRAM cell.

Such an SRAM is typically implemented on an integrated circuit die according to a process technology that forms semiconductor and metal interconnect structures onto the integrated circuit die. Typically, the semiconductor structures include diffusion regions and polysilicon structures for the transistors in the SRAM. The metal interconnect structures typically provide electrical interconnection between the transistors and other devices in the SRAM.

Such an integrated circuit process technology typically forms a set of contacts within each SRAM cell. Such contacts include contacts formed between metal interconnect structures and contacts formed between the diffusion regions of the transistors of the SRAM cell.

Defects sometimes occur in the semiconductor and metal interconnect structures of an integrated circuit during such a manufacturing process. Such manufacturing defects can cause failures in the contacts in the SRAM cells. Such manufacturing defects can also cause failures of individual transistors in the SRAM cells. Typically, manufacturing quality testing procedures are provided to detect such defects in newly manufactured integrated circuits.

During a typical manufacturing quality test procedure, the integrated circuits are placed in a highly specialized integrated circuit tester. Such a tester usually tests an SRAM by writing a predetermined data pattern to the SRAM cells, and then immediately reading the SRAM cells to verify the stored data pattern. If the data written to the SRAM does not match the data read from the SRAM, then the integrated circuit device is usually deemed defective.

Unfortunately, such a test procedure typically does not detect manufacturing defects that cause data retention problems in the SRAM cells. For example, an SRAM cell having a defective pull-up transistor at an internal data storage node retains stored charge for only a short period of time. The charge stored at the internal nodes of such an SRAM cell usually discharges through the diffusion regions of the transistors of the SRAM cell. A defective pull-up transistor usually cannot maintain the charge level at the internal node.

One prior method for detecting such data retention defects is to provide a tester delay interval that allows such a defective SRAM cell to discharge. Such a delay interval typically occurs between the write of the test data pattern to the SRAM and the subsequent read-verify of the SRAM.

Unfortunately such tester delays significantly increase the time required for testing each integrated circuit. An increase in tester time for each integrated circuit decreases the utility of the integrated circuit device tester. Typically, such a tester can perform tests on fewer devices in a fixed time period if tester delays are added to detect data retention problems in the SRAM cells.

As a consequence, additional integrated circuit testers must typically be provided to maintain a desired tester yield with such tester delays. Unfortunately, such integrated circuit testers are extremely expensive. The extra integrated circuit testers greatly increase the overall manufacturing costs for such integrated circuit devices.

SUMMARY AND OBJECTS OF THE INVENTION

One object of the present invention is test memory cells in an integrated circuit.

Another object of the present invention is test SRAM cells in an integrated circuit and to detect data retention defects in the SRAM cells.

A further object of the present invention is to provide stress circuitry in an SRAM to detect data retention defects in the SRAM cells.

Another object of the present invention is detect data retention defects in the SRAM cells by stressing the SRAM cells during access cycles to the SRAM.

Another object of the present invention is test SRAM circuitry on an integrated circuit by performing write, stress, and read-verify cycles on the SRAM.

These and other objects of the invention are provided by a memory circuit comprising a memory cell array having at least one memory cell coupled to a set of bit lines, an access circuit coupled to access the memory cell, and a discharge circuit coupled to stress the memory cell by discharging the bit lines during an access of the memory cell by the access circuit. The access circuit performs a stress cycle on the memory cell by activating the word line for the memory cell while activating a stress signal that controls the discharge circuit.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
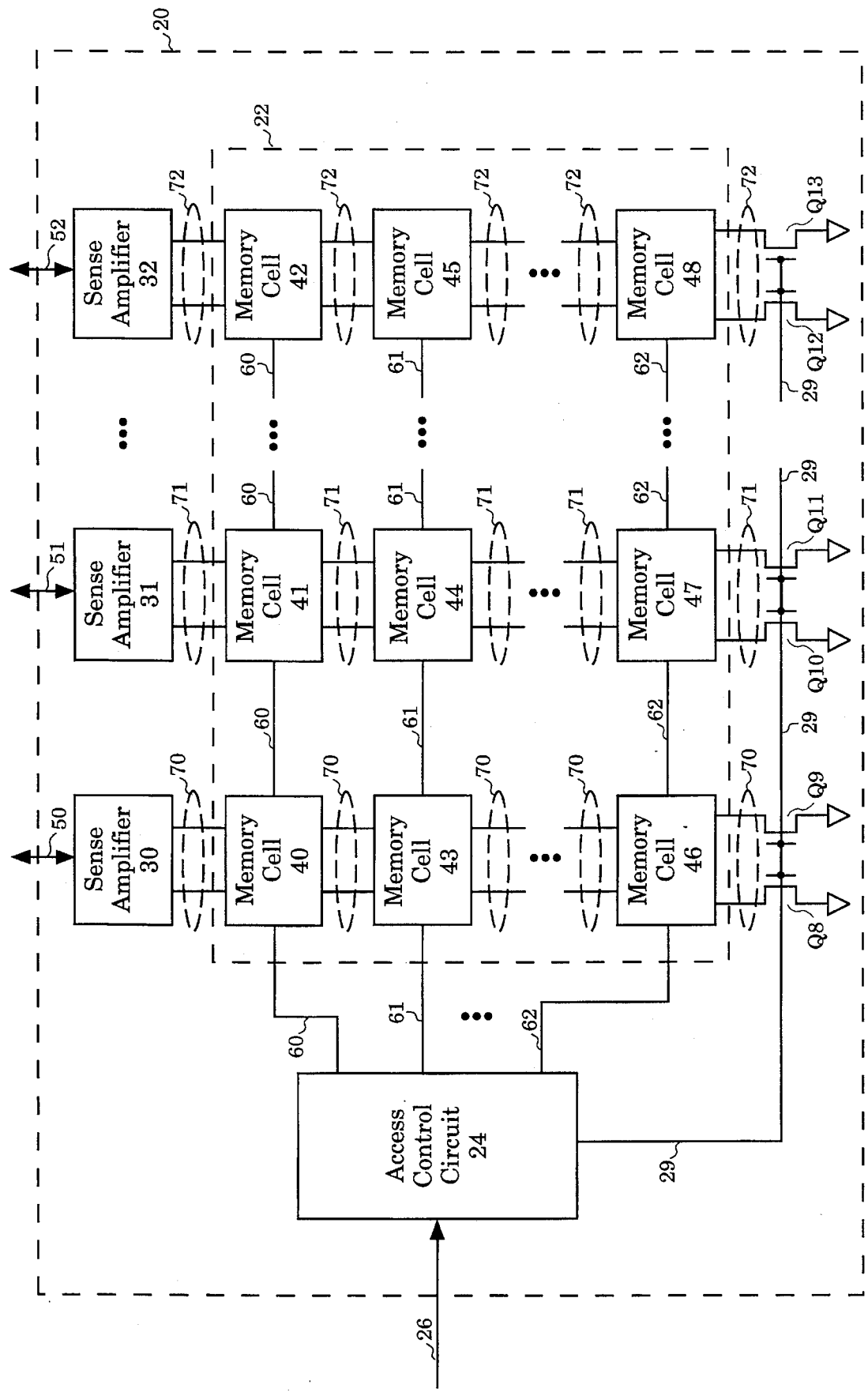
FIG. 1 illustrates a static random access memory (SRAM) for one embodiment which comprises a access control circuit, a set of sense amplifiers, and a memory cell array.

FIG. 1 illustrates a static random access memory (SRAM) 20 for one embodiment. The SRAM 20 comprises a access control circuit 24, a set of sense amplifiers 30–32, and a memory cell array 22. The memory cell array 22 comprises a set of memory cells 40–48. The SRAM 20 further comprises a set of pull-down transistors Q8–Q13.

The access control circuit 24 drives a set of word lines 60–62 of the memory cell array 22. The access control circuit 24 drives the word lines 60–62 to perform read and write operations to the memory cells 40–48.

Each word line 60–62 corresponds to a row of the memory cell array 22. For example, the word line 60 corresponds to a row of the memory cell array 22 comprising the memory cells 40–42. Similarly, the word line 61 corresponds to a row of the memory cell array 22 comprising the memory cells 43–45, and the word line 62 corresponds to a row comprising the memory cells 46–48.

The sense amplifiers 30–32 are coupled to sets of bit lines 70–72 of the memory cell array 22. The sense amplifiers 30–32 differentially sense data on the bit lines 70–72 during read operations on the memory cell array 22. The sense amplifiers 30–32 drive data onto the bit lines 70–72 during write operations to the memory cell array 22.

The sense amplifiers 30–32 perform precharge operations that drive the bit lines 70–72 to a high voltage level. The precharge operations on the bit lines 70–72 increase the access speed for the memory cell array 22 during subsequent read and write operations.

Each set of bit lines 70–72 comprises a pair of bit lines for a corresponding column of the memory cell array 22. For example, the bit lines 70 are coupled to a column of the memory cell array 22 comprising the memory cells 40, 43, and 46. Similarly, the bit lines 71 are coupled to a column comprising the memory cells 41, 44, and 47, and the bit lines 72 are coupled to a column comprising the memory cells 42, 45, and 48.

The access control circuit 24 enables stress tests on the memory cell array 22. A stress test comprises a series of write, stress, read cycles on the individual rows of the memory cell array 22. One write, stress, read-verify series stresses the memory cells 40–48 with a data pattern, and a subsequent write, stress, read-verify series stresses the memory cells 40–48 with a complementary data pattern. The complementary data patterns ensure that each memory cell 40–48 is stressed with a stored "one" and with a stored "zero."

The stress control signal 29 is inactive during read and write cycles to the memory cell array 22. The inactive stress control signal 29 maintains the transistors Q8–Q13 inactive. The transistors Q8–Q13 are relatively small devices and have minimal impact on the operation of the memory cell array 22. The transistors Q8–Q13 have substantially the same size as the inverter circuit transistors in each of the memory cells 40–48. The capacitance of the bit lines 70–72 is relatively large compared to the transistors Q8–Q13 because a large number of memory cells are coupled to each set of bit lines 70–72.

During a write cycle to the SRAM 20, the access control circuit 24 receives a write address over an address bus 26, and the sense amplifiers 30–32 receive data over a set of data lines 50–52. Each sense amplifier 30–32 receives a data bit over the corresponding data line 50–52. For example, the sense amplifier 30 receives a data bit over the data line 50, the sense amplifier 31 receives a data bit over the data line 51, and the sense amplifier 32 receives a data bit over the data line 52.

The sense amplifiers 30–32 drive the received write data onto the bit lines 70–72. The access control circuit 24 drives one of the word lines 60–62 according to the write address received over the address bus 26 during the write operation. The activated word line 60–62 determines the row of the memory cell array 22 that is written with the data received over the data bus 58.

During a read cycle on the SRAM 20, the access control circuit 24 receives a read address over the address bus 26. The access control circuit 24 decodes the received read address, and drives the appropriate word line 60–62. The activated word line 60–62 causes the corresponding row of the memory cell array 22 to drive data onto the bit lines 70–72. The sense amplifiers 30–32 each detect a voltage differential on the corresponding bit lines 70–72 and amplify the voltage differential. The sense amplifiers 30–32 then drive the sensed data from the memory cell array 22 over the data lines 50–52.

During a stress cycle on the SRAM 20, the access control circuit 24 receives a stress address over the address bus 26. The access control circuit 24 decodes the received stress address, and drives the appropriate word line 60–62. The access control circuit 24 causes a stress cycle on the selected row of the memory cell array 22 by activating the stress control signal 29. The stress control signal 29 switches on the pull down transistors Q8–Q13. The transistors Q8–Q13 pull down the voltage levels on the bit lines 70–72. The low voltages on the bit lines 70–72 stress the charge storage capabilities of the memory cells in the selected row of the memory cell array 22.

Figure 2:
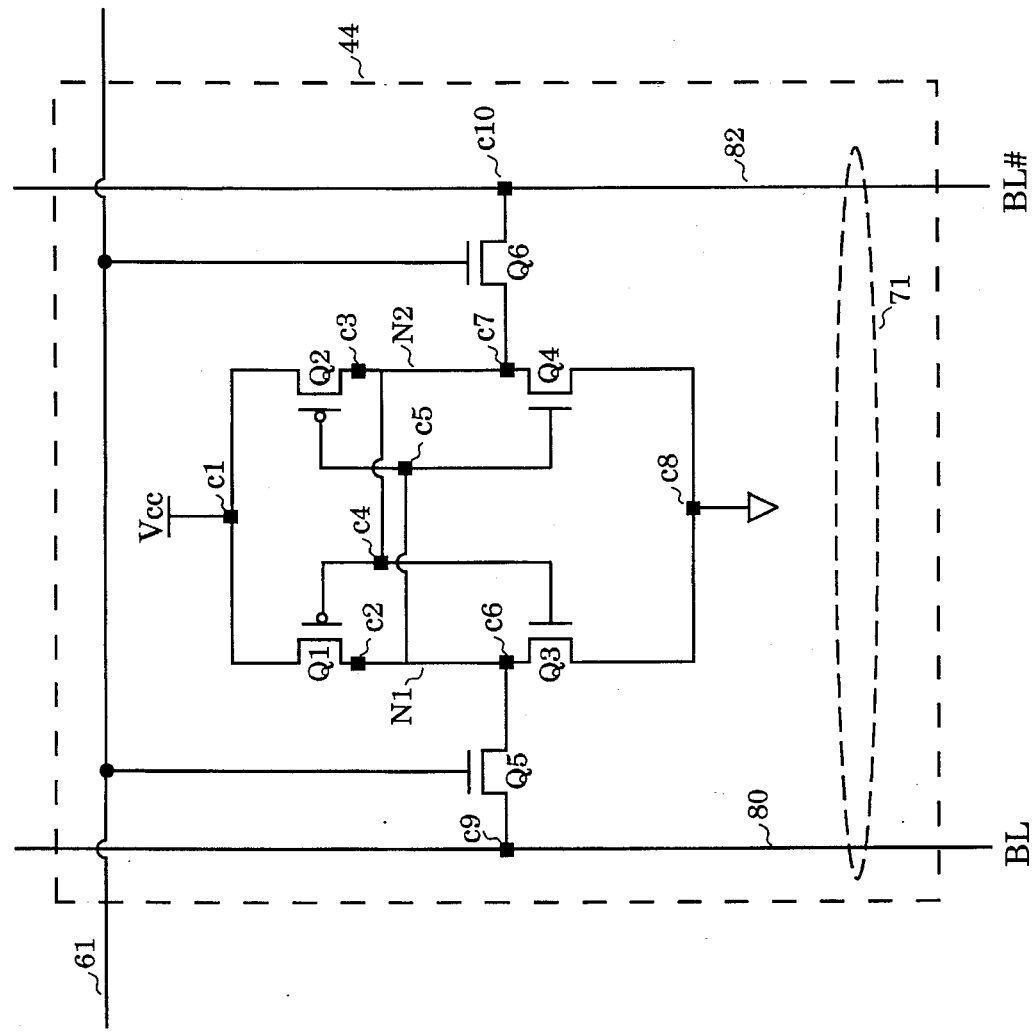
FIG. 2 illustrates a memory cell for one embodiment which comprises cross coupled inverter circuits and pass gate circuits.

FIG. 2 illustrates the memory cell 44 for one embodiment. The memory cells 40–43, and 45–48 are substantially similar to the memory cell 44. The memory cell 44 comprises a set of transistors Q1–Q6. The transistors Q1–Q4 are arranged as cross coupled inverter circuits.

The bit lines 71 comprise a bit line (BL) 80 and an inverted bit line (BL#) 82. The transistor Q5 is a pass gate that couples charge between an internal node N1 and the bit line 80. The transistor Q5 is activated via the word line 61. The transistor Q6 is a pass gate that couples charge between an internal node N2 and the bit line 82. The transistor Q6 is activated via the word line 61.

Also shown are a set of contacts c1–c10. The contacts c1–c10 represent contacts between diffusion regions of transistors and contacts between metal interconnect structures of the integrated circuit die that contains the SRAM 20.

During a stress cycle on the memory cell 44, the access control circuit 24 activates the stress control signal 29. The activated stress control signal 29 switches on the transistors Q10 and Q11. The transistors Q10 and Q11 pull down the voltages on the bit lines 80 and 82. The access control circuit 24 also activates the word line 61 during the stress cycle on the memory cell 44. The activated word line 61 switches on the transistors Q5 and Q6.

Assume that a "1" (high voltage level) is stored at the internal node N1 at the start of the stress cycle on the memory cell 44. Assume also that the memory cell 44 is a healthy SRAM cell. The activated transistor Q10 pulls down the voltage on the bit line 80 and the activated transistor Q5 attempts to pull down voltage at the internal node N1. However, the pull-up transistor Q1 enables the internal node N1 to sink current through the transistor Q5 and maintain a relatively high voltage with respect to the bit line 80.

Now assume that a "1" is stored at the internal node N1 at the start of the stress cycle on the memory cell 44 and that the contact c2 is defective or that the transistor Q1 is defective. The activated transistors Q10 and Q11 pull down the voltages on the bit lines 80 and 82, respectively. The activated word line 61 switches on the pass gate transistors Q5 and Q6. The transistor Q5 conducts and pulls down the voltage at the internal node N1. The voltage at the internal node N1 follows the declining voltage on the bit line 80. The declining voltage on the internal node N1 degrades the current drive capability of the transistor Q4. The reduced current drive capability of the transistor Q4 causes the voltage at the internal node N2 to rise rather than maintain the normal low level voltage.

As the voltage at the internal node N2 reaches the transistor threshold voltage ($V_{tn}$), the transistor Q3 switches on and begins conducting. The conducting transistor Q3 further lowers the voltage at the internal node N1. Without the pull-up transistor Q1 operating effectively, the voltage at the internal node N1 eventually flips the memory cell 44.

Thereafter, during the read-verify cycle on the memory cell 44, a zero is read from the memory cell 44 where a one was originally written.

A symmetrical failure occurs in the memory cell 44 if the contact c1 or the contact c8 is defective. Under such conditions, a stress cycle on the memory cell 44 pulls the voltages at the internal nodes N1 and N2 to a low voltage level. During a subsequent read-verify cycle on the memory cell 44, both internal nodes N1 and N2 have a high voltage level. As a consequence, the sense amplifier 31 detects a high voltage level on both bit lines 80 and 82 during the read-verify cycle.

For one embodiment, the sense amplifier 31 contains an internal latch that provides hysteresis on data sensed from the memory cell 44. Under such conditions the read-verify operation returns the same data as the previous read cycle on the memory cell array 22 if both internal nodes N1 and N2 have a high voltage level. Therefore, such symmetric failures can be detected by reversing the data pattern for write, stress, read-verify cycle sequences on the memory cell 44.

For another embodiment, the sense amplifier 31 does not contain an internal latch. However, the sense amplifiers 30–32 are usually slightly unbalanced. Therefore, if the memory cell 44 is stressed with a zero stored at the internal node N1 and then stressed with a one stored at the internal node N1, the sense amplifier 31 detects a failure under one of the states.

Figure 3:
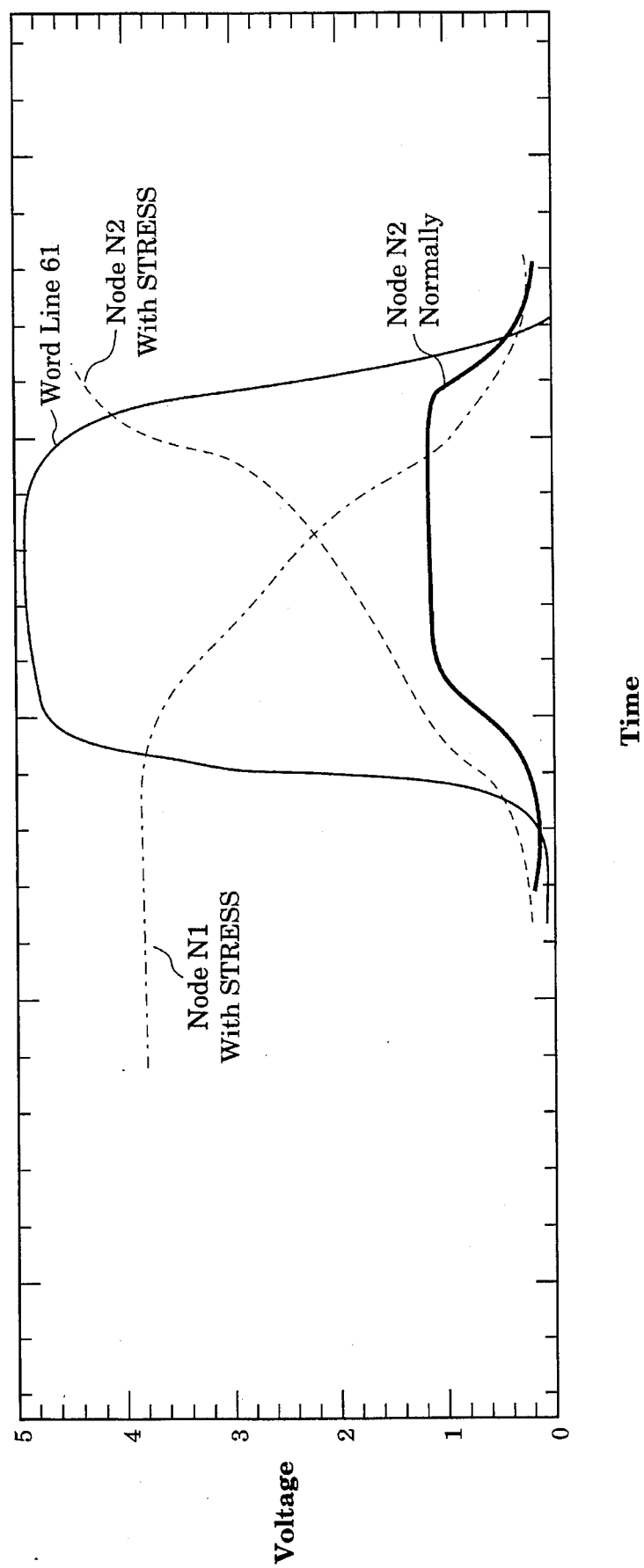
FIG. 3 illustrates a stress cycle on a memory cell for one embodiment which shows voltage reversals at the internal nodes during a stress cycle.

FIG. 3 illustrates a stress cycle on the memory cell 44. The access pulse on the word line 61 for the memory cell 44 is shown. Initially, the internal node N1 has a high voltage level and the internal node N2 has a low voltage level. The voltage reversals at the internal nodes N1 and N2 is illustrated during a stress cycle. Also illustrated is the voltage at the internal node N2 during a normal read cycle to the memory cell 44.

Figure 4:
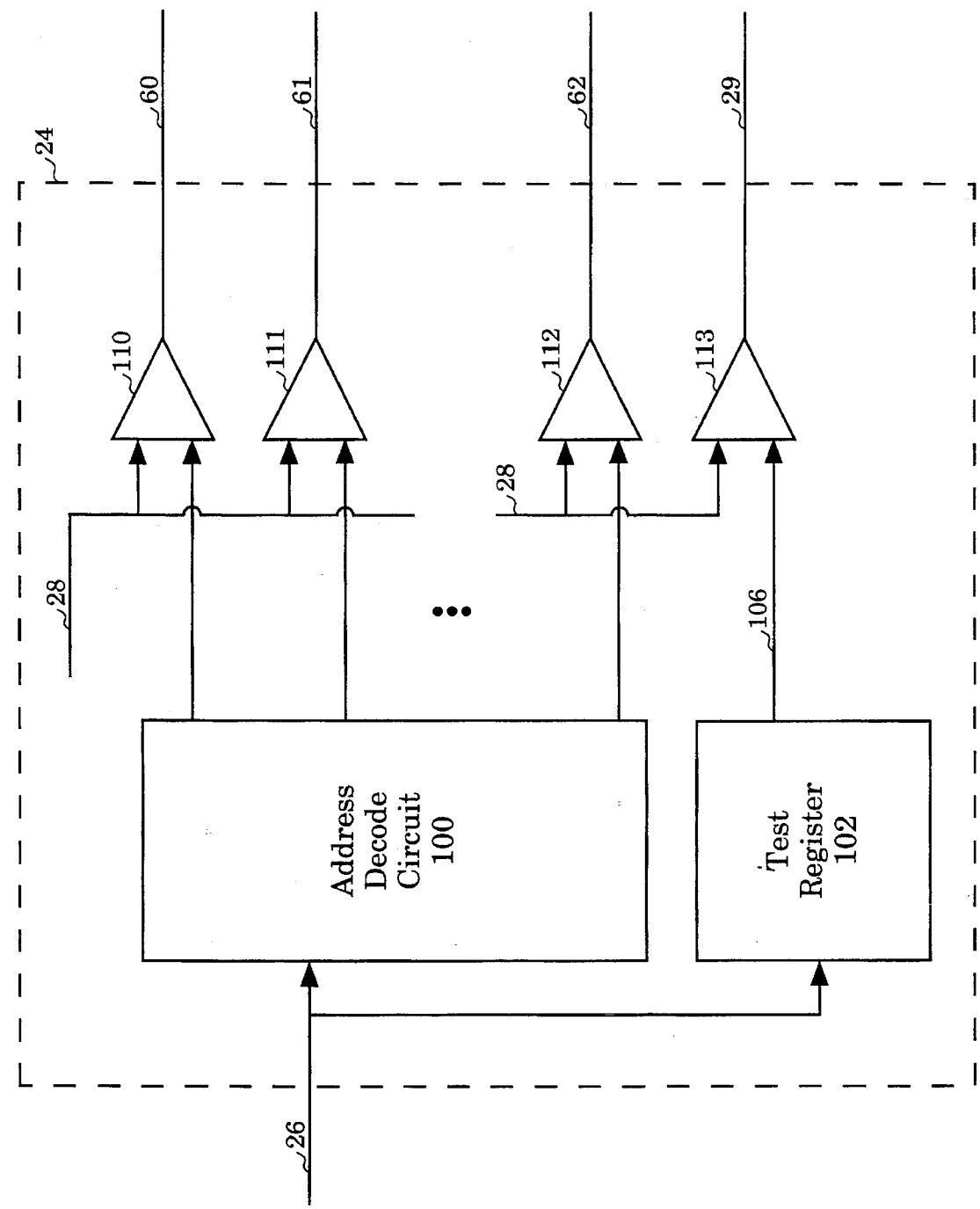
FIG. 4 illustrates the access control circuit which comprises an address decode circuit, a test register, and a set of drivers.

FIG. 4 illustrates the access control circuit 24 for one embodiment. The access control circuit 24 comprises an address decode circuit 100, a test register 102, and a set of drivers 110–113.

The address decode circuit 100 receives addresses over the address bus 26. The address decode circuit 100 decodes the received addresses and asserts the appropriate word line 60–62 through the drivers 110–112. The activated word lines 60–62 are synchronized by a timing pulse provided via a timing signal line 28.

The contents of the test register 102 select between stress cycles to the memory cell array 22 and normal read or write access cycles to the memory cell array 22. If a stress cycle is selected, the test register 102 generates a stress control signal 106. The stress control signal 106 is gated with a timing pulse on the timing signal line 28 to provide the stress control signal 29 for the pull down transistors Q8–Q13.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A memory circuit comprising:
   a memory cell array comprising at least one memory cell coupled to a first bit line and a second bit line;
   an access circuit coupled to access the memory cell;
   a discharge circuit coupled to stress the memory cell by discharging the first bit line and the second bit line during an access of the memory cell by the access circuit, wherein the discharge circuit comprises
      a first pull-down transistor coupled between the first bit line and a predetermined low voltage, and
      a second pull-down transistor coupled between the second bit line and the predetermined low voltage.

2. The memory circuit of claim 1, wherein the access circuit accesses the memory cell by activating a word line coupled to the memory cell.

3. The memory circuit of claim 2, wherein the discharge circuit comprises a first discharge transistor coupled to the first bit line and a second discharge transistor coupled to the second bit line, the first and second discharge transistors activated by a stress control signal from the access circuit.

4. The memory circuit of claim 3, wherein the access circuit performs a stress cycle on the memory cell by activating the word line for the memory cell while activating the stress control signal for the first and second discharge transistors.

5. A memory circuit, comprising:
   a memory cell array comprising at least one memory cell coupled to a first bit line and a second bit line, wherein the memory cell comprises
      a pair of cross coupled inverters coupled to a first internal node and a second internal node,
      a first pass gate coupled between the first internal node and the first bit line,
      a second pass gate coupled between the second internal node and the second bit line;
   an access circuit coupled to access the memory cell, wherein the access circuit accesses the memory cell by activating a word line coupled to the memory cell;
   a discharge circuit coupled to stress the memory cell by discharging the first bit line and the second bit line during an access of the memory cell by the access circuit, wherein the discharge circuit comprises a first discharge transistor coupled to the first bit line and a second discharge transistor coupled to the second bit line, the first and second discharge transistors activated by a stress control signal from the access circuit, wherein the access circuit performs a stress cycle on the memory cell by activating the word line for the memory cell while activating the stress control signal for the first and second discharge transistors.

6. A memory cell comprising:
   a pair of cross coupled inverters coupled to a first internal node and a second internal node of the memory cell;
   circuitry for stressing the memory cell by concurrently discharging both the first internal node and the second internal node.

7. The memory cell of claim 6, wherein the circuitry for stressing the memory cell comprises:

a first pass gate coupled between the first internal node and a first bit line;

a second pass gate coupled between the second internal node and a second bit line;

a first discharge transistor coupled between the first bit line and a predetermined low voltage level; and a second discharge transistor coupled between the second bit line and the predetermined low voltage level.

8. The memory cell of claim 7 wherein the circuitry for stressing the memory cell further comprises:

an access circuit coupled to provide a stress control enable signal to the first and second discharge transistors.

9. The memory cell of claim 8 wherein the access circuit is coupled to provide a word line input to the memory cell.

10. The memory cell of claim 9, wherein the access circuit performs a stress cycle on the memory cell by activating the word line for the memory cell while activating the stress control signal for the first and second discharge transistors.

* * * * *